United States Patent
Hata

(10) Patent No.: US 8,563,223 B2
(45) Date of Patent: Oct. 22, 2013

(54) PHOTOSENSITIVE RESIN COMPOSITION AND LAMINATE

(75) Inventor: Yosuke Hata, Tokyo (JP)

(73) Assignee: Asahi Kasei E-Materials Corporation, Tokyo (JP)

( * ) Notice: Subject to any disclaimer, the term of this patent is extended or adjusted under 35 U.S.C. 154(b) by 890 days.

(21) Appl. No.: 12/594,540

(22) PCT Filed: Mar. 6, 2008

(86) PCT No.: PCT/JP2008/054006
§ 371 (c)(1),
(2), (4) Date: Oct. 2, 2009

(87) PCT Pub. No.: WO2008/126526
PCT Pub. Date: Oct. 23, 2008

(65) Prior Publication Data
US 2010/0119977 A1    May 13, 2010

(30) Foreign Application Priority Data
Apr. 4, 2007 (JP) .................. 2007-097916

(51) Int. Cl.
*G03F 7/004* (2006.01)
(52) U.S. Cl.
USPC .................. 430/287.1; 430/286.1; 430/281.1
(58) Field of Classification Search
USPC .................. 430/287.1, 286.1, 281.1
See application file for complete search history.

(56) References Cited

U.S. PATENT DOCUMENTS

| | | |
|---|---|---|
| 5,221,595 A | 6/1993 | Lingnau et al. |
| 2009/0029289 A1 | 1/2009 | Miyasaka et al. |

FOREIGN PATENT DOCUMENTS

| | | |
|---|---|---|
| JP | 4-223470 | 8/1992 |
| JP | 2005-215142 | 8/2005 |
| JP | 2005-325030 | 11/2005 |
| JP | 2006-241086 | 9/2006 |
| JP | 2007-4138 | 1/2007 |
| WO | WO 2006/126480 | 11/2006 |
| WO | WO 2007/010614 | 1/2007 |

OTHER PUBLICATIONS

International Search Report from the Japanese Patent Office mailed Apr. 8, 2008, for International Application No. PCT/JP2008/054006, filed Mar. 6, 2008.

*Primary Examiner* — Daborah Chacko Davis
(74) *Attorney, Agent, or Firm* — Finnegan, Henderson, Farabow, Garrett & Dunner, L.L.P.

(57) ABSTRACT

A photosensitive resin composition which has satisfactory compatibility in dry-film formation, has sensitivity equally to two lights of i-line and h-line, is excellent in resolution and adhesion, and can be developed with an alkaline aqueous solution. Also provided are: a layered photosensitive-resin product including the photosensitive resin composition; a method of forming a resist pattern on a substrate with the layered photosensitive-resin product; and a use of the resist pattern. The photosensitive resin composition comprises: (a) 20-90 mass % thermoplastic copolymer which includes comonomer units derived from an α,β-unsaturated monomer having a carboxy group and which has an acid equivalent of 100-600 and a weight-average molecular weight of 5,000-500,000; (b) 5-75 mass % addition-polymerizable monomer having at least one ethylenically unsaturated terminal group; (c) 0.01-30 mass % photopolymerization initiator comprising a triarylimidazolyl dimer; and (d) 0.001-10 mass % pyrazoline compound represented by a specific general formula.

3 Claims, No Drawings

PHOTOSENSITIVE RESIN COMPOSITION AND LAMINATE

TECHNICAL FIELD

The present invention relates to a photosensitive resin composition capable of being developed by an alkaline aqueous solution, a photosensitive resin laminate in which the photosensitive resin composition is laminated on a support, a method for forming a resist pattern on a substrate using the photosensitive resin laminate, and applications of the resist pattern. More particularly, the present invention relates to a photosensitive resin composition capable of imparting a resist pattern preferable for use as a protective mask member during production of printed wiring boards, production of flexible printed wiring boards, production of lead frames for mounting IC chips (to be simply referred to as lead frames), metal foil precision processing for metal mask production and the like, production of BGA (ball grid array), CSP (chip size package) and other semiconductor packages, production of tape substrates represented by TAB (tape automated bonding) and COF (chip on film: semiconductor IC mounted on a film-like microwiring substrate), production of semiconductor bump electrodes, production of members such as ITO electrodes, address electrodes or electromagnetic wave shielding for use in the field of flat panel displays, and processing of base materials by sandblasting.

BACKGROUND ART

Printed wiring boards are conventionally produced by photolithography. Photolithography refers to a method in which a photosensitive resin composition is coated onto a substrate, an exposed portion of the photosensitive resin composition is polymerized and cured by exposing to a light pattern, a resist pattern is formed on the substrate by removing the unexposed portion with a developing solution, and after having formed a semiconductor pattern by etching or plating treatment, the resist pattern is separated and removed from the substrate to form a semiconductor pattern on the substrate.

In the photolithography method as described above, in the lamination of a layer composed of a photosensitive resin composition (to be referred to as a "photosensitive resin layer") on a substrate, either a method in which a photoresist solution is coated onto the substrate and dried, or a method in which a photosensitive resin laminate (referred to as a "dry film resist"), comprised by sequentially laminating a support, a photosensitive resin layer and as necessary, a protective layer, is laminated onto a substrate, is used. The latter dry film resist method is frequently used when producing printed wiring boards.

The following provides a brief description of a method for producing a printed wiring board using the dry film resist method as described above.

First, in the case of having a protective layer such as a polyethylene film, this is separated from the photosensitive resin layer. Next, the photosensitive resin layer and a support are laminated on a substrate such as a copper clad laminate using a laminator so that the substrate, photosensitive resin layer and support are laminated in that order. Next, the exposed portion is polymerized and cured by exposing the photosensitive resin layer to activating light, such as i-rays (365 nm) emitted by a super high pressure mercury lamp, through a photomask having a wiring pattern. Next, the support composed of polyethylene terephthalate and the like is separated. Next, the unexposed portion of the photosensitive resin layer is removed by dissolving or dispersing with a developing solution such as a weakly alkaline aqueous solution to form a resist pattern on the substrate. Next, known etching treatment or pattern plating treatment is carried out by using the formed resist pattern as a protective mask. Finally, the resist pattern is separated from the substrate to produce a substrate having a conductor pattern, namely a printed wiring board.

Accompanying the decreasing size of wire spacing in printed wiring boards in recent years, demands on the dry film resist method to provide higher resolution are increasing. In addition, higher sensitivity is also being required from the viewpoint of improving productivity. On the other hand, exposure methods have become increasingly diversified according to the application, and mask-less exposure methods such as laser direct writing, which eliminate the need for a photomask, are demonstrating rapid proliferation. The light sources used in mask-less exposure can be broadly divided into those using i-rays (365 nm) and those using h-rays (405 nm), and these light sources are used according to the application by taking advantage of their respective merits. In the case of dry film resist methods, emphasis is placed on being able to use both types of exposure devices under the same conditions, or in other words, demonstrating equal sensitivity for both types of exposure devices and being able to form highly sensitive, high-resolution and highly adhesive resist patterns.

In the case of photosensitive resin compositions for dry film resists, benzophenone, Michler's ketone and derivatives thereof conventionally used as photopolymerization initiators demonstrated localized absorbance in the vicinity of a wavelength of 360 nm. Thus, the sensitivity of a dry film resist using these photopolymerization initiators decreases as the wavelength of the exposure light source approaches the visible region, and it is difficult to obtain adequate resolution and adhesion for light sources having a wavelength of 400 nm or more.

In addition, other photopolymerization initiators in the form of thioxanthone and derivatives thereof can be combined to demonstrate high sensitivity to exposure light sources having a wavelength in the vicinity of 380 nm by selecting a suitable intensifier. However, even if such combinations are used, there are many cases in which adequate sensitivity is unable to be obtained in the formed resist pattern, and sensitivity again decreases with respect to exposure light sources having a wavelength of 400 nm or more.

Patent Document 1 discloses photoreaction initiators having high photosensitivity and satisfactory image reproducibility in the form of hexaaryl biimidazole and 1,3-diarylpyrazoline or 1-aryl-3-aralkenyl-pyrazoline, and describes examples of fabricating a dry film resist. However, when the inventors of the invention fabricated dry film photoresists having photosensitive resin layers containing compounds specifically described in Patent Document 1 in the form of 1,5-diphenyl-3-styryl-pyrazoline and 1-phenyl-3-(4-methyl-styryl)-5-(4-methyl-phenyl)-pyrazoline, the compounds remained in the photosensitive resin layer in the form of undissolved substances, thereby preventing use as dry film resists.

Although Patent Documents 2 and 3 describe examples using 1-phenyl-3-(4-tert-butyl-styryl)-5-(p-tert-butyl-phenyl)-pyrazoline, although this compound demonstrates high sensitivity to h-rays having a wavelength of 405 nm, sensitivity equal to that of exposure by h-rays was unable to be obtained with i-rays having a wavelength of 365 nm. For reasons such as this, there is a need for a photosensitive resin composition that demonstrates favorable compatibility as a photosensitive resin composition for dry film resist methods, has equal sensitivity to both i-ray and h-ray light sources, and demonstrates satisfactory sensitivity along with high resolution and adhesion.

Patent Document 1: Japanese Unexamined Patent Publication No. H04-223470
Patent Document 2: Japanese Unexamined Patent Publication No. 2005-215142
Patent Document 3: Japanese Unexamined Patent Publication No. 2007-004138

DISCLOSURE OF THE INVENTION

Problems to be Solved by the Invention

An object of the present invention is to provide a photosensitive resin composition having satisfactory compatibility when producing a dry film, demonstrating equal sensitivity to both i-ray and h-ray light sources, having superior resolution and adhesion, and being able to be developed by an alkaline aqueous solution, a photosensitive resin laminate using the photosensitive resin composition, a method for forming a resist pattern on a substrate using the photosensitive resin laminate, and application of the resist pattern.

Means for Solving the Problems

As a result of conducting extensive studies to achieve the aforementioned object, the inventors of the present invention found that the aforementioned object can be achieved by the constitution of the present invention as described below, thereby leading to completion of the present invention.

Namely, the present invention is as indicated below.

1. A photosensitive resin composition, comprising: (a) 20 to 90% by weight of a thermoplastic copolymer containing as a copolymerizing component thereof a monomer containing an α,β-unsaturated carboxyl group, and having an acid equivalent of 100 to 600 and a weight average molecular weight of 5,000 to 500,000, (b) 5 to 75% by weight of an addition polymerizable monomer having at least one terminal ethylenic unsaturated group, (c) 0.01 to 30% by weight of a photopolymerization initiator containing a triaryl imidazolyl dimer, and (d) 0.001 to 10% by weight of a pyrazoline compound represented by the following general formula (I):

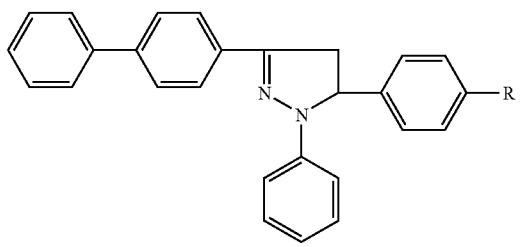

(I)

(wherein, R represents a linear or branched alkyl group having 4 to 12 carbon atoms).

2. The photosensitive resin composition described in 1 above, wherein the (d) pyrazoline compound is at least one type of compound selected from the group consisting of 1-phenyl-3-(4-biphenyl)-5-(4-tert-butyl-phenyl)-pyrazoline and 1-phenyl-3-(4-biphenyl)-5-(4-tert-octyl-phenyl)-pyrazoline.

3. A photosensitive resin laminate, comprising: laminating the photosensitive resin composition described in 1 or 2 above onto a support.

4. A method for forming a resist pattern on a substrate, comprising: a lamination step in which a photosensitive resin layer is formed using the photosensitive resin laminate described in 3 above, an exposure step and a developing step, in that order.

5. The method for forming a resist pattern described in 4 above, wherein the exposure step is a step in which exposure is carried out by direct writing.

6. A method for producing a printed wiring board, comprising: a step in which a substrate, on which a resist pattern has been formed according to the method for forming a resist pattern described in 4 or 5 above, is etched or plated.

7. A method for producing a lead frame, comprising: a step in which a substrate, on which a resist pattern has been formed according to the method for forming a resist pattern described in 4 or 5 above, is etched.

8. A method for producing a semiconductor package, comprising: a step in which a substrate, on which a resist pattern has been formed according to the method for forming a resist pattern described in 4 or 5 above, is etched or plated.

9. A method for producing a relief substrate, comprising: a step in which a substrate, on which a resist pattern has been formed according to the method for forming a resist pattern described in 4 or 5 above, is sandblasted.

Effects of the Invention

The photosensitive resin composition of the present invention has satisfactory solubility when producing a dry film, demonstrates equal sensitivity to both i-ray and h-ray light sources, has superior resolution and adhesion, and can be developed by an alkaline aqueous solution. The method for forming a resist pattern of the present invention is able to provide a resist pattern having superior sensitivity, resolution and adhesion, and can be preferably used in the production of printed wiring boards, the production of lead frames, the production of semiconductor packages and the production of flat panel displays.

BEST MODE FOR CARRYING OUT THE INVENTION

The following provides a detailed explanation of the present invention.

<Photosensitive Resin Composition>

The photosensitive resin composition of the present invention comprises (a) 20 to 90% by weight of a thermoplastic copolymer containing as a copolymerizing component thereof a monomer containing an α,β-unsaturated carboxyl group, and having an acid equivalent of 100 to 600 and a weight average molecular weight of 5,000 to 500,000, (b) 5 to 75% by weight of an addition polymerizable monomer having at least one terminal ethylenic unsaturated group, (c) 0.01 to 30% by weight of a photopolymerization initiator containing a triaryl imidazolyl dimer, and (d) 0.001 to 10% by weight of a pyrazoline compound represented by the following general formula (I):

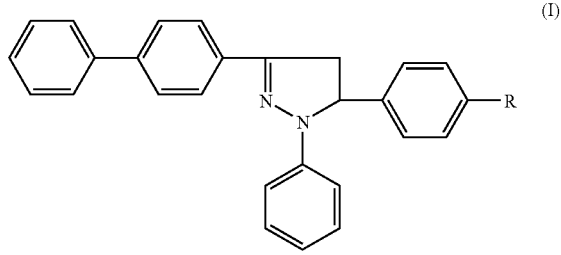

(I)

(wherein, R represents a linear or branched alkyl group having 4 to 12 carbon atoms).

(a) Thermoplastic Copolymer

In the photosensitive resin composition of the present invention, a thermoplastic copolymer is used for the thermoplastic copolymer of (a) that contains as a copolymerizing component thereof a monomer containing an α,β-unsaturated carboxyl group, and has an acid equivalent of 100 to 600 and a weight average molecular weight of 5,000 to 500,000.

The carboxyl group in the thermoplastic copolymer is required to enable the photosensitive resin composition to have developability and separability with respect to a developing solution and separating solution consisting of an alkaline aqueous solution.

The acid equivalent is preferably 100 to 600 and more preferably 250 to 450. The acid equivalent is 100 or more from the viewpoint of ensuring compatibility with a coating solvent, other components in the composition, and the addition polymerizable monomer of (b) described below, and is 600 or less from the viewpoint of maintaining developability and separability. Here, acid equivalent refers to the weight (grams) of thermoplastic polymer having one equivalent of carboxyl groups therein. Furthermore, measurement of acid equivalent is carried out by potentiometric titration in a 0.1 mol/l aqueous NaOH solution using a Hiranuma Reporting Titrator (COM-555).

The weight average molecular weight is preferably 5,000 to 500,000. The weight average molecular weight is 5,000 or more from the viewpoint of maintaining a uniform thickness of the dry film resist and obtaining resistance to the developing solution, and is 500,000 or less from the viewpoint of maintaining developability. The weight average molecular weight is more preferably 20,000 to 100,000. In this case, weight average molecular weight refers to the weight average molecular weight measured using a calibration curve prepared from a reference polystyrene (Shodex Standard SM-105, Showa Denko K.K.) by gel permeation chromatography (GPC). The weight average molecular weight can be measured under the following conditions using a gel permeation chromatography system manufactured by JASCO Corp.

Differential refractometer: RI-1530
Pump: PU-1580
Degasser: DG-980-50
Column oven: CO-1560
Column: KF-8025, KF-806M×2, KF-807 in that order
Eluent: THF The thermoplastic copolymer is preferably either a copolymer composed of at least one type of a first monomer described below, or a copolymer composed of at least one type of the first monomer and at least one type of a second monomer described below.

The first monomer is a monomer having an α,β-unsaturated carboxyl group in a molecule thereof, examples of which include (meth)acrylic acid, fumaric acid, silicic acid, crotonic acid, itaconic acid, maleic acid and maleic acid hemiester, with (meth)acrylic acid being particularly preferable. Here, (meth)acrylic indicates both acrylic and methacrylic, and is to apply similarly hereinafter.

The second monomer is a monomer at least having a polymerizable unsaturated group in a molecule thereof, examples of which include esters such as methyl (meth)acrylate, ethyl (meth)acrylate, n-propyl(meth)acrylate, iso-propyl(meth)acrylate, n-butyl (meth)acrylate, iso-butyl(meth)acrylate, tert-butyl (meth)acrylate, 2-hydroxyethyl(meth)acrylate, 2-hydroxypropyl(meth)acrylate, 2-ethylhexyl(meth)acrylate, benzyl(meth)acrylate or vinyl alcohol, vinyl acetate, (meth)acrylonitrile, styrene and polymerizable styrene derivatives, with methyl (meth)acrylate, n-butyl(meth)acrylate, styrene and benzyl(meth)acrylate being particularly preferable.

The amount of the thermoplastic copolymer contained in the photosensitive resin composition of the present invention is within the range of 20 to 90% by weight, and preferably within the range of 25 to 70% by weight. This amount is 20% by weight or less from the viewpoint of maintaining alkaline developability, and is 90% by weight or less from the viewpoint of enabling the resist pattern formed by exposure to adequately demonstrate performance as a resist.

(b) Addition Polymerizable Monomer

The addition polymerizable monomer of (b) used in the photosensitive resin composition of the present invention preferably contains at least one type of compound selected from the group consisting of compounds represented by the following formula (II) and compounds represented by the following formula (III) from the viewpoint of resolution and adhesion:

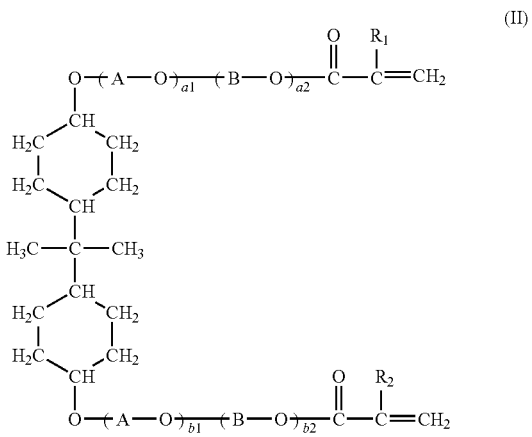

(II)

(wherein, $R_1$ and $R_2$ respectively and independently represent H or $CH_3$, A and B respectively and independently represent an alkylene group having 2 to 4 carbon atoms, a1, a2, b1 and b2 are 0 or positive integers, and the total of a1, a2, b1 and b2 is 2 to 40); and,

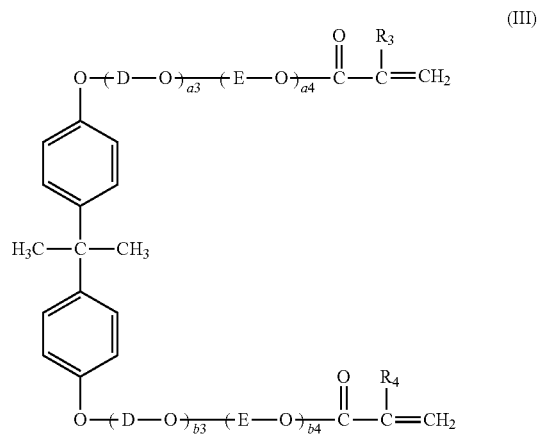

(III)

(wherein, $R_3$ and $R_4$ respectively and independently represent H or $CH_3$, D and E respectively and independently represent an alkylene group having 2 to 4 carbon atoms, a3, a4, b3 and b4 are 0 or positive integers, and the total of a3, a4, b3 and b4 is 2 to 40).

Specific examples of compounds represented by the aforementioned formula (II) include 2,2-bis{(4-acryloxypolyethyleneoxy)cyclohexyl}propane and 2,2-bis{(4-methacryloxypolyethyleneoxy)cyclohexyl}propane. The polyethyleneoxy group possessed by these compounds is preferably a group selected from the group consisting of a monoethyleneoxy group, diethyleneoxy group, triethyleneoxy group, tetraethyleneoxy group, pentaethyleneoxy group, hexaethyleneoxy group, heptaethyleneoxy group, octaethyleneoxy group, nonaethyleneoxy group, decaethyleneoxy group, undecaethyleneoxy group, dodecaethyleneoxy group, tridecaethyleneoxy group, tetradecaethyleneoxy group and pentadecaethyleneoxy group.

In addition, other examples include 2,2-bis{4-acryloxypolyalkyleneoxy}cyclohexyl}propane and 2,2-bis{(4-methacryloxypolyalkyleneoxy)cyclohexyl}propane. Examples of the polyalkyleneoxy groups possessed by these compounds include mixtures of ethyleneoxy groups and propyleneoxy groups, with block-structured or random-structure addition products of an octaethyleneoxy group and a dipropyleneoxy group, block-structured or random-structured addition products of a tetraethyleneoxy group and a tetrapropyleneoxy group, and block-structured or random-structured addition products of a pentadecaethyleneoxy group and a dipropyleneoxy group being preferable. In the formulas, the total of a1, a2, b1 and b2 is more preferably 2 to 30. Among these examples, 2,2-bis{(4-methacryloxypentaethyleneoxy)cyclohexyl}propane is most preferable.

Specific examples of compounds represented by the aforementioned formula (III) include 2,2-bis{(4-acryloxypolyethyleneoxy)phenyl}propane and 2,2-bis{(4-methacryloxypolyethyleneoxy)phenyl}propane. The polyethyleneoxy group possessed by these compounds is preferably a group selected from the group consisting of a monoethyleneoxy group, diethyleneoxy group, triethyleneoxy group, tetraethyleneoxy group, pentaethyleneoxy group, hexaethyleneoxy group, heptaethyleneoxy group, octaethyleneoxy group, nonaethyleneoxy group, decaethyleneoxy group, undecaethyleneoxy group, dodecaethyleneoxy group, tridecaethyleneoxy group, tetradecaethyleneoxy group and pentadecaethyleneoxy group.

In addition, other examples include 2,2-bis{4-acryloxypolyalkyleneoxy}phenyl}propane and 2,2-bis{(4-methacryloxypolyalkyleneoxy)phenyl}propane. Examples of the polyalkyleneoxy groups possessed by these compounds include mixtures of ethyleneoxy groups and propyleneoxy groups, with block-structured or random-structure addition products of an octaethyleneoxy group and a dipropyleneoxy group, block-structured or random-structured addition products of a tetraethyleneoxy group and a tetrapropyleneoxy group, and block-structured or random-structured addition products of a pentadecaethyleneoxy group and a dipropyleneoxy group being preferable. In the formulas, a3, a4, b3 and b4 are zero or positive integers, and the total of a3, a4, b3 and b4 is preferably 2 to 30. Among these examples, 2,2-bis{(4-methacryloxypentaethyleneoxy)phenyl}propane is most preferable.

These may be used alone or two or more types may be used in combination.

In the case the photosensitive resin composition of the present invention contains at least one type of compound selected from the group consisting of compounds represented by the aforementioned formula (II) and compounds represented by the aforementioned formula (III), the total content of the compounds is preferably 5 to 40% by weight and more preferably 10 to 30% by weight in the photosensitive resin composition. This amount is preferably 5% by weight or more from the viewpoint of expressing high adhesion, while the amount is preferably 40% by weight or less from the viewpoint of inhibiting a delay in separation of the cured resist.

A known compound having at least one terminal ethylenic unsaturated group in addition to the compounds described above can also be used for the addition polymerizable monomer of (b) used in the photosensitive resin composition of the present invention.

Examples of such compounds include 4-nonylphenylheptaethylene glycol dipropylene glycol acrylate, 2-hydroxy-3-phenoxypropyl acrylate, phenoxyhexaethylene glycol acrylate, reaction products of a hemiester compound of acrylic anhydride and 2-hydroxypropyl acrylate and propylene oxide (trade name: OE-A200, Nippon Shokubai Co., Ltd.), 4-n-octylphenoxypentapropylene glycol acrylate, 1,6-hexandiol (meth)acrylate or 1,4-cyclohexanediol di(meth)acrylate, polyoxyalkylene glycol di(meth)acrylates, such as polypropylene glycol di(meth)acrylate, polyethylene glycol di(meth)acrylate, polyoxyethylene polyoxypropylene glycol di(meth)acrylate, 2-di(p-hydroxyphenyl)propane di(meth)acrylate, glycerol tri(meth)acrylate, pentaerythritol penta(meth)acrylate or trimethylolpropane triglycidyl ether tri(meth)acrylate, polyfunctional group (meth)acrylates containing a urethane group such as urethanation products of hexamethylene diisocyanate and nonapropylene glycol monomethacrylate, and polyfunctional group (meth)acrylates of isocyanuric acid ester compounds. These may be used alone or two or more types may be used in combination.

The amount of the addition polymerizable monomer of (b) contained in the photosensitive resin composition of the present invention is within the range of 5 to 75% by weight and more preferably within the range of 15 to 60% by weight. This amount is 5% by weight or more from the viewpoint of inhibiting defective curing and delays in development time, and is 75% by weight or less from the viewpoint of inhibiting cold flow and delays in separation of the cured resist.

(c) Photopolymerization Initiator

The photopolymerization initiator of (c) is contained in the photosensitive resin composition of the present invention, and has a triaryl imidazolyl dimer as an essential component thereof.

Examples of this triaryl imidazolyl dimer include 2-(o-chlorophenyl)-4,5-diphenylimidazolyl dimer, 2,2',5-tris(o-chlorophenyl)-4-(3,4-dimethoxyphenyl)-4',5'-diphenylimidazolyl dimer, 2,4,5-tris-(o-chlorophenyl)-diphenylimidazolyl dimer, 2-(o-chlorophenyl)-bis-4,5-(3,4-dimethoxyphenyl)-imidazolyl dimer, 2,2'-bis(2-fluorophenyl)-4,4',5,5'-tetrakis-(3-methoxyphenyl)-imidazolyl dimer, 2,2'-bis(2,3-difluoromethylphenyl)-4,4',5,5'-tetrakis-(3-methoxyphenyl)-imidazolyl dimer, 2,2'-bis-(2,4-difluorophenyl)-4,4',5,5'-tetrakis-(3-methoxyphenyl)-imidazolyl dimer, 2,2'-bis-(2,5-difluorophenyl)-4,4',5,5'-tetrakis-(3-methoxyphenyl)-imidazolyl dimer, 2,2'-bis-(2,6-difluorophenyl)-4,4',5,5'-tetrakis-(3-methoxyphenyl)-imidazolyl dimer, 2,2'-bis-(2,3,4-trifluorophenyl)-4,4',5,5'-tetrakis-(3-methoxyphenyl)-imidazolyl dimer, 2,2'-bis-(2,3,5-trifluorophenyl)-4,4',5,5'-tetrakis-(3-methoxyphenyl)-imidazolyl dimer, 2,2'-bis-(2,3,6-trifluorophenyl)-4,4',5,5'-tetrakis-(3-methoxyphenyl)-imidazolyl dimer, 2,2'-bis-(2,4,5-trifluorophenyl)-4,4',5,5'-tetrakis-(3-methoxyphenyl)-imidazolyl dimer, 2,2'-bis-(2,4,6-trifluorophenyl)-4,4',5,5'-tetrakis-(3-methoxyphenyl)-imidazolyl dimer, 2,2'-bis-(2,3,4,5-tetrafluorophenyl)-4,4',5,5'-tetrakis-(3-methoxyphenyl)-imidazolyl dimer, 2,2'-bis-(2,3,4,6-tetrafluorophenyl)-4,4',5,5'-tetrakis-(3-methoxyphenyl)-imidazolyl dimer, and 2,2'-bis-(2,3,4,5,6-pentafluorophenyl)-4,4',5,5'-tetrakis-(3-methoxyphenyl)-imidazolyl dimer. In particular, 2-(o-chlorophenyl)-4,5-diphenyl imidazolyl dimer is a photopolymerization initiator that is highly effective with respect to resolution and cured film strength, and is therefore used preferably. These photopolymerization initiators are used alone or two or more types are used in combination.

The amount of the triaryl imidazolyl dimer contained in the photosensitive resin composition of the present invention is preferably 0.01 to 30% by weight, more preferably 0.05 to 10% by weight, and most preferably 0.1 to 5% by weight. This amount is required to be 0.01% by weight or more from the viewpoint of obtaining adequate sensitivity, and is required to be 30% by weight or less from the viewpoint of maintaining high resolution. In addition, a photopolymerization initiator other than the triaryl imidazolyl dimer can also be used in combination therewith in the photosensitive resin composition of the present invention.

Examples of such photopolymerization initiators include quinones such as 2-ethylanthraquinone, octaethylanthraquinone, 1,2-benzanthraquinone, 2,3-benzanthraquinone, 2-phenylanthraquinone, 2,3-diphenylanthraquinone, 1-chloroanthraquinone, 1,4-naphthoquinone, 9,10-phenathraquinone, 2-methyl-1,4-naphthoquinone, 2,3-dimethylanthraquinone or 3-chloro-2-methylanthraquinone, aromatic ketones such as benzophenone, Michler's ketone [4,4-bis(dimethylamino)benzophenone], 4,4'-bis(diethylamino)benzophenone or benzoin, benzoin ethers such as benzoin ethyl ether, benzoin phenyl ether, methyl benzoin, ethyl benzoin, benzyl dimethyl ketal or benzyl diethyl ketal, N-phenylglycines such as N-phenylglycine, N-methyl-N-phenylglycine or N-ethyl-N-phenylglycine, combinations of thioxanthones and alkylaminobenzoates such as the combination of ethyl thioxanthone and ethyl dimethylaminobenzoate, the combination of 2-chlorothioxanthone and ethyl dimethyaminobenzoate, or the combination of isopropyl thioxanthone and ethyl dimethylaminobenzoate, oxime esters such as 1-phenyl-1,2-propanedione-2-O-benzoin oxime or 1-phenyl-1,2-propanedione-2-(O-ethoxycarbonyl) oxime, acridines such as 1,7-bis(9-acridinyl)heptane (N-1717, Asahi Denko K.K.) or 9-phenylacridine, thioxanthones such as diethylthioxanthone, isopropylthioxanthone or chlorothioxanthone, and dialkylaminobenzoic acid esters such as ethyl dimethylaminobenzoate or ethyl diethylaminobenzoate.

Among these, Michler's ketone or 4,4'-bis(diethylamino) benzophenone is particularly preferable.

The content of the photopolymerization initiator containing the triaryl imidazolyl dimer of (c) is within the range of 0.01 to 30% by weight, preferably within the range of 0.05 to 10% by weight, and most preferably within the range of 0.1 to 5% by weight. This amount is required to be 0.01% by weight or more from the viewpoint of obtaining adequate sensitivity, and is required to be 30% by weight or less from the viewpoint of solubility when putting the photosensitive resin composition into solution.

(d) Pyrazoline Compound

The photosensitive resin composition of the present invention has for an essential component thereof a (d) pyrazoline compound in the form of a compound represented by the following formula (I):

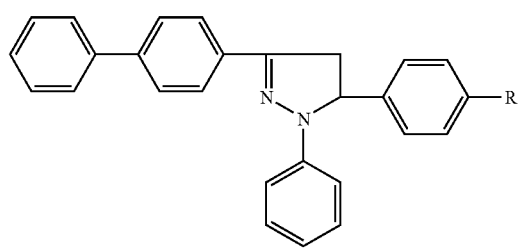

(I)

(wherein, R represents an alkyl group having 4 to 12 carbon atoms).

Examples of compounds represented by formula (I) above include 1-phenyl-3-(4-biphenyl)-5-(4-n-butyl-phenyl)-pyrazoline, 1-phenyl-3-(4-biphenyl)-5-(4-tert-butyl-phenyl)-pyrazoline, 1-phenyl-3-(4-biphenyl)-5-(4-isobutyl-phenyl)-pyrazoline, 1-phenyl-3-(4-biphenyl)-5-(4-n-pentyl-phenyl)-pyrazoline, 1-phenyl-3-(4-biphenyl)-5-(4-isopentyl-phenyl)-pyrazoline, 1-phenyl-3-(4-biphenyl)-5-(4-neopentyl-phenyl)-pyrazoline, 1-phenyl-3-(4-biphenyl)-5-(4-hexyl-phenyl)-pyrazoline, 1-phenyl-3-(4-biphenyl)-5-(4-heptyl-phenyl)-pyrazoline, 1-phenyl-3-(4-biphenyl)-5-(4-n-octyl-phenyl)-pyrazoline, 1-phenyl-3-(4-biphenyl)-5-(4-tert-octyl-phenyl)-pyrazoline, 1-phenyl-3-(4-biphenyl)-5-(4-nonyl-phenyl)-pyrazoline, 1-phenyl-3-(4-biphenyl)-5-(4-decyl-phenyl)-pyrazoline, 1-phenyl-3-(4-biphenyl)-5-(4-undecyl-phenyl)-pyrazoline, and 1-phenyl-3-(4-biphenyl)-5-(4-dodecyl-phenyl)-pyrazoline.

Among the aforementioned compounds represented by general formula (I), 1-phenyl-3-(4-biphenyl)-5-(4-tert-butyl-phenyl)-pyrazoline and 1-phenyl-3-(4-biphenyl)-5-(4-tert-octyl-phenyl)-pyrazoline are preferable.

One or more types of compounds represented by formula (I) are contained in the photosensitive resin composition of the present invention, and the total amount thereof is within the range of 0.001 to 10% by weight, more preferably within the range of 0.005 to 5% by weight, and most preferably within the range of 0.05 to 2% by weight. This amount is 0.001% by weight or more from the viewpoint of improving sensitivity and resolution, and is 10% by weight or less from the viewpoint of improving compatibility and dispersibility with the thermoplastic copolymer and the addition polymerizable monomer having a terminal ethylenic unsaturated group, and demonstrating the effects of a dry film photoresist.

In the present invention, the pyrazoline compound of (d) demonstrates the effect of an intensifier by using in combination with the aforementioned photopolymerization initiator containing a triaryl imidazolyl dimer of (c).

(e) Other Components

In addition to the components described above, coloring substances exemplified by dyes and pigments can also be used in the photosensitive resin composition of the present invention. Examples of such coloring substances include phthalocyanine green, crystal violet, methyl orange, Nile blue 2B, Victoria blue, malachite green, basic blue 20 and diamond green.

In addition, a leuco dye may also be added to the photosensitive resin composition of the present invention so as to be able to yield a visible image following exposure. Examples of such leuco dyes include leuco crystal violet and fluoran dye. Contrast is particularly good in the case of using leuco crystal violet, thereby making this preferable. Examples of fluoran dyes include 3-diethylamino-6-methyl-7-anilinofluoran, 3-dibutylamino-6-methyl-7-anilinofluoran, 2-(2-chloroanilino)-6-dibutylaminofluoran, 2-bromo-3-methyl-6-dibutylaminofluoran, 2-N,N-dibenzylamino-6-diethylaminofluoran, 3-diethylamino-7-chloroaminofluoran, 3,6-dimethoxyfluoran and 3-diethylamino-6-methoxy-7-aminofluoran.

The combined use of a leuco dye and halogen compound in the photosensitive resin composition is a preferable embodiment of the invention from the viewpoint of adhesion and contrast.

Examples of halogen compounds include amyl bromide, isoamyl bromide, isobutylene bromide, ethylene bromide, diphenylmethyl bromide, benzal bromide, methylene bromide, tribromomethyl phenyl sulfone, carbon tetrabromide, tris(2,3-dibromopropyl)phosphate, trichloroacetoamide, amyl iodide, isobutyl iodide, 1,1,1-trichloro-2,2-bis(p-chlorophenyl)ethane, hexachloroethane and halogenated triazine compounds.

The content of halogen compound in the photosensitive resin composition in the case of containing a halogen compound is preferably within the range of 0.01 to 5% by weight.

The contents of the coloring substance and leuco dye in the photosensitive resin composition are preferably within the range of 0.01 to 10% by weight each. These contents are preferably 0.01% by weight or more from the viewpoint of having contrast between exposed portions and unexposed portions, and are preferably 10% by weight or less from the viewpoint of maintaining storage stability.

Moreover, the photosensitive resin composition of the present invention preferably contains a radical polymerization inhibitor or benzotriazole in order to improve the thermal stability and storage stability thereof.

Examples of such radical polymerization inhibitors include p-methoxyphenol, hydroquinone, pyrogallol, naphthylamine, tert-butylcatechol, cuprous chloride, 2,6-di-tert-butyl-p-cresol, 2,2'-methylenebis(4-methyl-6-tert-butylphenol), 2,2'-methylenebis(4-ethyl-6-tert-butylphenol), aluminum nitrosophenylhydroxyamine and diphenylnitrosoamine.

In addition, examples of benzotriazoles include 1,2,3-benzotriazole, 1-chloro-1,2,3-benzotriazole, bis(N-2-ethylhexyl)aminomethylene-1,2,3-benzotriazole, bis(N-2-ethylhexyl)aminomethylene-1,2,3-tolyltriazole and bis(N-2-hydroxyethyl)aminomethylene-1,2,3-benzotriazole. In addition, examples of carboxybenzotriazoles include 4-carboxy-1,2,3-benzotriazole, 5-carboxy-1,2,3-benzotriazole, N—(N,N-di-2-ethylhexyl)aminomethylene carboxybenzotriazole, N—(N,N-di-2-hydroxyethyl)aminomethylene benzotriazole and N—(N,N-di-2-ethylhexyl)aminoethylene carboxybenzotriazole.

The amount of radical polymerization inhibitor or benzotriazole added to the photosensitive resin composition is preferably within the range of 0.01 to 3% by weight and more preferably within the range of 0.05 to 1% by weight. This amount is preferably 0.01% by weight or more from the viewpoint of imparting storage stability to the photosensitive resin composition, and is preferably 3% by weight or less from the viewpoint of maintaining photosensitivity.

The radical polymerization inhibitor or benzotriazole may be used alone or two or more types may be used in combination.

A plasticizer may also be contained in the photosensitive resin composition of the present invention as necessary. Examples of such plasticizers include glycol-esters such as polyethylene glycol, polypropylene glycol, polyoxypropylene polyoxyethylene ether, polyoxyethylene monomethyl ether, polyoxypropylene monomethyl ether, polyoxyethylene polyoxypropylene monomethyl ether, polyoxyethylene monoethyl ether, polyoxypropylene monoethyl ether or polyoxyethylene polyoxypropylene monoethyl ether, and phthalic acid esters such as diethyl phthalate, o-toluene sulfonic acid amide, p-toluene sulfonic acid amide, tributyl citrate, triethyl citrate, triethyl acetyl citrate, tri-n-propyl acetyl citrate and tri-n-butyl acetyl citrate.

The content of plasticizer in the case of containing a plasticizer in the photosensitive resin composition is preferably within the range of 5 to 50% by weight and more preferably within the range of 5 to 30% by weight. This amount is preferably 5% by weight or more from the viewpoint of inhibiting delays in development time and imparting flexibility to the cured film, and is preferably 50% by weight or less from the viewpoint of inhibiting inadequate curing and cold flow.

The photosensitive resin composition of the present invention may also contain a solvent in order to obtain a mixed liquid in which the aforementioned (a) to (e) are uniformly dissolved. Examples of solvents used include ketones as exemplified by methyl ethyl ketone (MEK), and alcohols such as methanol, ethanol or isopropyl alcohol. A solvent is preferably prepared so that the viscosity of a mixed liquid of the photosensitive resin composition is 500 to 4000 mPa·sec at the temperature of 25° C.

<Photosensitive Resin Laminate>

Although the photosensitive resin laminate of the present invention is composed of a photosensitive resin layer and a support for supporting that layer, the photosensitive resin laminate may also have a protective layer on the surface on the opposite side from the support of the photosensitive resin layer as necessary.

The support used here is preferably a transparent support through which is transmitted light radiated from an exposure light source. Examples of such supports include polyethylene terephthalate film, polyvinyl alcohol film, polyvinyl chloride film, vinyl chloride copolymer film, polyvinylidene chloride film, vinylidene chloride copolymer film, polymethyl methacrylate copolymer film, polystyrene film, polyacrylonitrile film, styrene copolymer film, polyamide film and cellulose derivative films. These films can be stretched as necessary prior to use. The haze value is preferably 5 or less. Although a thin film is advantageous in terms of image formability and economy, the film thickness is preferably 10 to 30 μm based on the need to maintain strength and the like.

In addition, an important characteristic of the protective layer used in the photosensitive resin laminate is that the adhesive strength with the photosensitive resin laminate of the protective layer be sufficiently less than that of the support so that it can be easily separated from the photosensitive resin laminate. For example, a polyethylene film or polypropylene film is preferably used for the protective layer. In addition, a film having superior separability disclosed in Japanese Unexamined Patent Publication No. S59-202457 can be used.

The film thickness of the protective layer is preferably 10 to 100 μm and more preferably 10 to 50 μm.

Although varying according to the application, the thickness of the photosensitive resin layer in the photosensitive resin laminate of the present invention is preferably within the range of 5 to 100 μm and more preferably within the range of 7 to 60 μm, with a thin photosensitive resin layer yielding improved resolution, and a thick photosensitive resin layer yielding improved film strength.

A conventionally known method can be used for the method for producing the photosensitive resin laminate of the present invention by sequentially laminating the support, the photosensitive resin layer and, as necessary, the protective layer.

For example, the photosensitive resin composition used in the photosensitive resin layer is mixed with a solvent in which they are dissolved to obtain a mixed liquid followed by first coating the mixed liquid onto the support using a bar coater or roll coater, drying and laminating the photosensitive resin layer composed of the photosensitive resin composition on the support.

Next, a photosensitive resin laminate can be produced by laminating the protective layer onto the photosensitive resin layer as necessary.

<Resist Pattern Formation Method>

A resist pattern using the photosensitive resin laminate of the present invention can be formed by a process comprising a lamination step, an exposure step and a development step.

As an example of a specific method thereof, the lamination step is first carried out using a laminator. In the case the photosensitive resin laminate has a protective layer, the protective layer is removed followed by laminating the photosensitive resin layer onto the surface of a substrate with a laminator by hot pressing. In this case, the photosensitive resin layer may be laminated on only one side or on both sides of the substrate surface. The heating temperature at this time is generally 40 to 160° C. In addition, adhesion and chemical resistance can be improved by carrying out hot pressing two or more times. At this time, a two-stage laminator provided with tandem rollers may be used for pressing, or pressing may be carried out by repeatedly passing between rollers.

Next, the exposure step is carried out using an exposer. The support is separated as necessary followed by exposing to activating light through a photomask. The amount of exposure is determined by the luminosity of the light source and exposure time. The amount of exposure may also be measured with an actinometer.

A mask-less exposure method may also be used in the exposure step. Mask-less exposure involves exposing by writing directly onto a substrate without using a mask. A semiconductor laser or super high pressure mercury lamp and the like having a wavelength of 350 to 410 mm is used for the light source. The writing pattern is controlled by a computer, and the pattern is exposed by sequentially scanning the substrate with a light beam. The amount of exposure in this case is determined by the luminosity of the light source and the movement speed of the substrate.

Next, a development step is carried out using a developing device. In the case a support is present on the photosensitive resin layer after exposure, this is removed as necessary followed by removing unexposed portions by developing using a developing solution in the form of an alkaline aqueous solution to obtain a resist image. An aqueous solution such as $Na_2CO_3$ or $K_2CO_3$ is used for the alkaline aqueous solution. Although these are selected according to the properties of the photosensitive resin layer, an $Na_2CO_3$ aqueous solution having a concentration of 0.2 to 2% by weight and at a temperature of 20 to 40° C. is typical. A surfactant, an antifoaming agent or a small amount of an organic solvent for promoting development may also be mixed with the alkaline aqueous solution.

Although a resist pattern is obtained as a result of the aforementioned steps, depending on the case, a heating step can also be carried out at 100 to 300° C. This heating step makes it possible to further improve chemical resistance. A heating oven comprised of a hot air, infrared, or far infrared system can be used for heating.

<Printed Wiring Board Production Method>

The method for producing a printed wiring board of the present invention consists of carrying out the method for forming a resist pattern described above using a copper clad laminate or flexible board for the substrate followed by going through the steps described below.

First, a semiconductor pattern is formed on the copper side of the substrate that has been exposed by development using a known method such as etching or plating.

Subsequently, the resist pattern is separated from the substrate with an aqueous solution having stronger alkalinity than the developing solution to obtain a desired printed wiring board. Although there are no particular limitations on the alkaline aqueous solution used for separation (to also be referred to as the "separating solution"), an aqueous solution of NaOH or KOH having a concentration of 2 to 5% by weight and at a temperature of 40 to 70° C. is used typically. A small amount of water-soluble solvent may be added to the separating solution.

<Lead Frame Production Method>

The method for producing a lead frame of the present invention consists of forming a resist pattern as described above using a copper, copper alloy, ferrous alloy or other metal sheet for the substrate followed by going through the steps described below.

First, a semiconductor pattern is formed by etching the substrate that has been exposed by development.

Subsequently, the resist pattern is then removed by a method similar to that used in the production of a printed wiring board as described above to obtain a desired lead frame.

<Semiconductor Package Production Method>

The method for producing a semiconductor package of the present invention consists of forming a resist pattern as described above using for the substrate a wafer on which formation of an LSI circuit has been completed, followed by going through the steps described below.

A semiconductor pattern is formed by plating copper or solder in the like in the form of columns in the openings exposed by development.

Subsequently, the resist pattern is removed by a method similar to that used in the production of a printed wiring board as previously described followed by removing the thin metal layer at those portions other than the column-shaped plating to obtain a desired semiconductor package.

<Relief Substrate Production Method>

In the case of using the photosensitive resin laminate of the present invention as a dry film resist and processing a substrate by sandblasting, the photosensitive resin laminate is laminated, exposed and developed on the substrate in the form of a processed base material using a method similar to the method described above.

Here, examples of the processed base material include a glass base material, a glass base material coated with a glass rib paste, a ceramic base material, a stainless steel or other metal base material, a silicon wafer, a processed mineral such as sapphire, and organic base materials such as a synthetic resin.

Moreover, a substrate having a relief pattern on a substrate, namely a relief substrate, can be obtained by going through a sandblasting step in which a blasting material is blown onto the formed resist pattern from above to etch to a desired depth, and a separation step in which resin remaining on the substrate is removed from the substrate with an alkaline separation solution and the like. A known material can be used for the blasting material used in the aforementioned sandblasting step, examples of which include microparticles on the order of 2 to 100 μm of SiC, $SiO_2$, $Al_2O_3$, $CaCO_3$, $ZrO_2$, glass or stainless steel. The relief substrate can be preferably used as, for example, a rear panel for a flat panel display.

EXAMPLES

Although the following provides a more detailed explanation of the present invention through examples and the like thereof, the present invention is not limited to these examples and the like.

First, an explanation is provided of a method for producing evaluation samples for examples and comparative examples, followed by indication of evaluation methods and evaluation results for the resulting samples.

Examples 1 to 6 and Comparative Examples 1 to 6

1. Production of Evaluation Samples

Photosensitive resin laminates of Examples 1 to 6 and Comparative Examples 1 to 6 were produced in the manner described below.

<Production of Photosensitive Resin Laminates>

Photosensitive resin compositions having the compositions shown in Table 1 along with solvents were stirred and mixed well followed by uniformly coating onto the surface of a support in the form of a polyethylene terephthalate film having a thickness of 19 μm using a bar coater and drying for 4 minutes in a dryer at 95° C. to obtain photosensitive resin layers. The thickness of the photosensitive resin layers was 40 μm.

Next, a protective layer in the form of a polyethylene film having a thickness of 23 μm was laminated onto the surface of the photosensitive resin layer not laminated with the polyethylene terephthalate film to obtain photosensitive resin laminates.

The names of material components in the photosensitive resin compositions represented with abbreviations in Table 1 are indicated in Table 2.

Furthermore, the compositions of Comparative Examples 1 to 5 do not contain component (d) used in the present invention. In addition, the composition of Comparative Example 6 does not contain the triaryl imidazolyl dimer used in the present invention.

TABLE 2

| Abb. | Components |
|---|---|
| P-1 | Methyl ethyl ketone solution containing 30% by weight of solid fraction of a copolymer composed of methyl methacrylate, methacrylic acid, n-propyl acrylate (weight ratio: 65/25/10) and having an acid equivalent of 344 and weight average molecular weight of 120,000 |
| P-2 | Methyl ethyl ketone solution containing 43% by weight of solid fraction of a copolymer composed of methyl methacrylate, methacrylic acid and styrene (weight ratio: 50/25/25) and having an acid equivalent of 340 and weight average molecular weight of 50,000 |
| M-1 | Urethanation product of hexamethylene diisocyanate and pentapropylene glycol monomethacrylate |
| M-2 | α,ω-dimethacrylate of triethylene glycol dodecapropylene glycol triethylene glycol |
| M-3 | 4-nonylphenyl heptaethylene glycol dipropylene glycol acrylate (LS-100A, NOF Corp.) |
| M-4 | Heptapropylene glycol dimethacrylate (TO-1559, Toagosei Co., Ltd.) |
| M-5 | Triacrylate comprising the addition of an average of 3 moles of ethylene oxide to trimethylolpropane (A-TMPT-3EO, Shin-Nakamura Chemical Co., Ltd.) |
| A-1 | 4,4'-bis(diethylamino)benzophenone |
| A-2 | 2-(o-chlorophenyl)-4,5-diphenylimidazolyl dimer |
| A-3 | 1,5-diphenyl-3-styryl-pyrazoline (Nippon Chemical Industrial Co., Ltd.) |
| A-4 | 1-phenyl-3-(4-tert-butyl-styryl)-5-(4-tert-butyl-phenyl)-pyrazoline (Nippon Chemical Industrial Co., Ltd.) |
| A-5 | 1-(4-(benzooxazol-2-yl)phenyl)-3-(4-tert-butylstyryl)-5-(4-tert-butylphenyl)-pyrazoline (Nippon Chemical Industrial Co., Ltd.) |
| A-6 | 1-phenyl-3-(4-biphenyl)-5-(4-isopropyl-phenyl)-pyrazoline (Nippon Chemical Industrial Co., Ltd.) |
| A-7 | 1-phenyl-3-(4-biphenyl)-5-(4-tert-butyl-phenyl)-pyrazoline (Nippon Chemical Industrial Co., Ltd.) |

TABLE 1

| | | Ex. 1 | Ex. 2 | Ex. 3 | Ex. 4 | Ex. 5 | Ex. 6 | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|---|---|---|---|---|---|
| Photo-sensitive resin composition (parts by weight) | P-1 | 33 | 33 | 33 | 33 | 33 | 33 | 33 | 33 | 33 | 33 | 33 | 33 |
| | P-2 | 107 | 107 | 107 | 107 | 107 | 107 | 107 | 107 | 107 | 107 | 107 | 107 |
| | M-1 | 15 | 15 | 15 | 15 | 15 | 15 | 15 | 15 | 15 | 15 | 15 | 15 |
| | M-2 | 20 | 20 | 20 | 20 | | | 20 | 20 | 20 | 20 | 20 | 20 |
| | M-3 | 5 | 5 | 5 | 5 | 5 | 5 | 5 | 5 | 5 | 5 | 5 | 5 |
| | M-4 | | | | | 20 | 20 | | | | | | |
| | M-5 | 5 | 5 | 5 | 5 | 5 | 5 | 5 | 5 | 5 | 5 | 5 | 5 |
| | A-1 | | | | | | | 0.3 | | | | | |
| | A-2 | 4 | 4 | 4 | 4 | 4 | 4 | 4 | | 4 | 4 | 4 | 4 |
| | A-3 | | | | | | | | 0.3 | | | | |
| | A-4 | | | | | | | | | 0.3 | | | |
| | A-5 | | | | | | | | | | 0.3 | | |
| | A-6 | | | | | | | | | | | 0.3 | |
| | A-7 | 0.3 | | | | | | | | | | | 0.3 |
| | A-8 | | 0.3 | 0.2 | 0.5 | 0.3 | 0.5 | | | | | | |
| | A-9 | 0.1 | 0.1 | 0.1 | 0.1 | 0.1 | 0.1 | 0.1 | 0.1 | 0.1 | 0.1 | 0.1 | 0.1 |
| | B-1 | 0.04 | 0.04 | 0.04 | 0.04 | 0.04 | 0.04 | 0.04 | 0.04 | 0.04 | 0.04 | 0.04 | 0.04 |
| | B-2 | 0.5 | 0.5 | 0.5 | 0.5 | 0.5 | 0.5 | 0.5 | 0.5 | 0.5 | 0.5 | 0.5 | 0.5 |
| Compatibility | (rank) | B | B | B | B | B | B | B | D | B | B | B | B |
| Sensitivity to i-ray exposer | (mJ/cm/rank) | 20/A | 20/A | 25/B | 15/A | 20/A | 15/A | 25/B | *1 | 30/B | 30/B | 20/A | *2 |
| Resolution for i-ray exposer | (μm/rank) | 35/B | 35/B | 35/B | 35/B | 30/A | 30/A | 35/B | *1 | 40/B | 40/B | 35/B | *2 |
| Adhesion for i-ray exposer | (μm/rank) | 35/B | 35/B | 35/B | 30/A | 35/B | 30/A | 40/B | *1 | 40/B | 40/B | 35/B | *2 |
| Sensitivity to h-ray exposer | mJ/cm$^2$/rank | 20/A | 20/A | 25/B | 15/A | 20/A | 15/A | 80/D | *1 | 20/A | 20/A | 30/B | *2 |
| Resolution for h-ray exposer | (μm/rank) | 35/B | 35/B | 35/B | 35/B | 30/A | 30/A | 100/D | *1 | 35/A | 35/A | 40/A | *2 |
| Adhesion for h-ray exposer | (μm/rank) | 35/B | 35/B | 35/B | 30/A | 35/B | 30/A | 100/D | *1 | 35/B | 35/B | 45/C | *2 |
| Light source selectivity | (rank) | B | B | B | B | B | B | D | *1 | D | D | D | *2 |

*1: Unable to be evaluated due to lack of dissolution on resist surface
*2: Resist lines not formed due to inadequate photocuring of resist TABLE 2-continued

| Abb. | Components |
|---|---|
| A-8 | 1-phenyl-3-(4-biphenyl)-5-(4-tert-octyl-phenyl)-pyrazoline (Nippon Chemical Industrial Co., Ltd.) |
| A-9 | N-phenylglycine |
| B-1 | Malachite green |
| B-2 | Leuco crystal violet |

<Substrate Surface Preparation>

Substrates used for evaluation of sensitivity and resolution were prepared by jet-scrubbing (Sakurandam R® #220, Japan Carlit Co., Ltd.) copper clad laminates at a spraying pressure of 0.20 MPa.

<Lamination>

Copper clad laminates preheated to 60° C. following surface preparation while removing the polyethylene film of the photosensitive resin laminates were laminated at a roll temperature of 105° C. with a hot roll laminator (AL-70, Asahi Kasei Engineering Corp.). The air pressure was 0.35 MPa and the laminating speed was 1.5 m/min.

<Exposure>

Exposure was carried out with 8 step tablets by evaluating sensitivity as described below with an i-ray type direct drawing exposure device (Paragon-9000 DI Exposer, Orbotech Ltd., light source: UV diode-pumped solid-state laser, Coherent Inc., dominant wavelength: 355±3 nm) and an h-ray type direct writing exposure device (DI-2080 DI Exposure, Oak Corp., light source: GaN blue-violet diode, dominant wavelength: 407±3 nm).

<Development>

The polyethylene terephthalate film was removed followed by spraying a 1% by weight aqueous $Na_2CO_3$ solution at 30° for a prescribed period of time to dissolve and remove unexposed portions of the photosensitive resin layer. At this time, the minimum amount of time required to completely dissolve the photosensitive resin layer at the unexposed portions was taken to be the minimum development time.

2. Evaluation Methods (1) Compatibility Test

The photosensitive resin compositions having the compositions shown in Table 1 were stirred and mixed well followed by uniformly coating onto the surface of a support in the form of a polyethylene terephthalate film having a thickness of 19 μm using a bar coater, and drying for 4 minutes in a dryer at 95° C. to form a photosensitive resin layer. Subsequently, the coated surface was observed visually and ranked in the manner indicated below.

B: Uniform coated surface

D: Precipitation of undissolved substances on coated surface (2) Sensitivity Evaluation Substrates for evaluation of sensitivity and resolution for which 15 minutes had elapsed following lamination were exposed using 21 step tablets manufactured by Stouffer Corp. in which brightness was changed in 21 stages from transparent to black. Following exposure, the substrates were developed using a development time equal to twice the minimum development time and then ranked in the manner described below according to an amount of exposure for which the number of step tablets on which the resist film was completely remaining was 8.

A: Amount of exposure of 20 $mJ/cm^2$ or less

B: Amount of exposure of more than 20 to 30 $mJ/cm^2$

C: Amount of exposure of more than 30 to 50 $mJ/cm^2$

D: Amount of exposure in excess of 50 $mJ/cm^2$ (3) Light Source Selectivity

Light source selectivity was defined as being able to use the same amount of exposure when using an i-ray type exposure device (Paragon-9000 DI Exposer, Orbotech Ltd.) and an h-ray type exposure device (DI-2080 DI Exposure, Oak Corp.), and was ranked in the manner indicated below.

B: Difference in amount of light for which the number of step tablets is 8 of less than 5 $mJ/cm^2$ D: Difference in amount of light for which the number of step tablets is 8 of 5 $mJ/cm^2$ or more (4) Evaluation of Resolution Substrates for evaluation of sensitivity and resolution for which 15 minutes had elapsed following lamination were exposed through a line pattern mask having a ratio of the width of the exposed portion to the width of the unexposed portion of 1:1. After developing for a development time equal to twice the minimum development time, the minimum mask line width for which cured resist lines were formed normally was taken to be the resolution value.

A: Resolution value of 30 μm or less

B: Resolution value of more than 30 to 40 μm

C: Resolution value of more than 40 μm (5) Evaluation of Adhesion

Substrates for evaluation of sensitivity and resolution for which 15 minutes had elapsed following lamination were exposed through a line pattern mask having a ratio of the width of the exposed portion to the width of the unexposed portion of 1:100. After developing for a development time equal to twice the minimum development time, the minimum mask width for which cured resist lines were formed normally was taken to be the adhesion value.

A: Adhesion value of 30 μm or less

B: Adhesion value of more than 30 to 40 μm

C: Adhesion value of more than 40 μm

3. Evaluation Results

Evaluation results for examples and comparative examples are shown in Table 1.

INDUSTRIAL APPLICABILITY

The present invention can be used in the production of printed wiring boards, production of lead frames for mounting IC chips, metal foil precision processing for metal mask production and the like, production of BGA, CSP and other semiconductor packages, production of tape substrates such as COF and TAB, production of semiconductor bump electrodes, production of ITO electrodes and address electrodes, production of barriers of flat panel displays such as electromagnetic wave shielding, and processing of base materials by sandblasting.

Examples of processing using sandblasting include organic EL glass cap sealing, silicon wafer hole formation and ceramic pin formation.

Moreover, processing using the sandblasting process of the present invention can be used to produce electrodes of metal material layers selected from the group consisting of ferroelectric films, precious metals, precious metal alloys, high melting point metals and high melting point, metal compounds.

The invention claimed is:

1. A photosensitive resin composition, comprising: a 20 to 90% by weight of a thermoplastic copolymer containing as a copolymerizing component a monomer containing an α,β-unsaturated carboxyl group, and having an acid equivalent of 100 to 600 and a weight average molecular weight of 5,000 to 500,000, (b) 5 to 75% by weight of an addition polymerizable monomer having at least one terminal ethylenic unsaturated group, (c) 0.01 to 30% by weight of a photopolymerization initiator containing a triaryl imidazolyl dimer, and (d) 0.001 to 10% by weight of a pyrazoline compound represented by the following general formula (I):

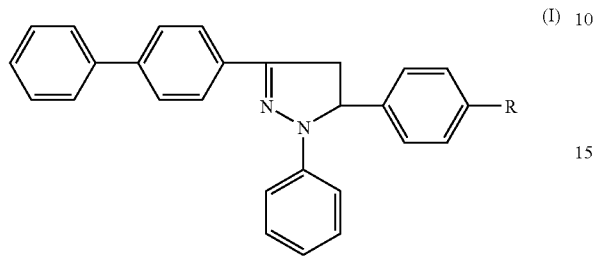

(wherein, R represents a linear or branched alkyl group having 4 to 12 carbon atoms).

2. The photosensitive resin composition according to claim 1, wherein the (d) pyrazoline compound is selected from the group of 1-phenyl-3-(4-biphenyl)-5-(4-tert-butyl-phenyl)-pyrazoline and 1-phenyl-3-(4-biphenyl)-5-(4-tert-octyl-phenyl)-pyrazoline.

3. A photosensitive resin laminate, comprising: the photosensitive resin composition according to claim 1 or 2 laminated on a support.

* * * * *